(12) United States Patent
Shen et al.

(10) Patent No.: US 8,074,155 B2
(45) Date of Patent: Dec. 6, 2011

(54) TAIL-BITING TURBO CODING TO ACCOMMODATE ANY INFORMATION AND/OR INTERLEAVER BLOCK SIZE

(75) Inventors: Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1129 days.

(21) Appl. No.: 11/830,327

(22) Filed: Jul. 30, 2007

(65) Prior Publication Data

US 2010/0031125 A1  Feb. 4, 2010

Related U.S. Application Data

(60) Provisional application No. 60/847,773, filed on Sep. 28, 2006, provisional application No. 60/899,191, filed on Feb. 2, 2007.

(51) Int. Cl.
*H03M 13/00* (2006.01)

(52) U.S. Cl. .......... 714/786; 714/774; 714/779

(58) Field of Classification Search ......... 714/779, 714/774, 786
See application file for complete search history.

(56) References Cited

U.S. PATENT DOCUMENTS

| | | | |
|---|---|---|---|
| 5,406,570 A | 4/1995 | Berrou et al. | |
| 5,446,747 A | 8/1995 | Berrou | |
| 5,563,897 A | 10/1996 | Pyndiah et al. | |
| 5,812,601 A * | 9/1998 | Schramm | 375/262 |
| 5,933,462 A * | 8/1999 | Viterbi et al. | 375/341 |
| 6,065,147 A | 5/2000 | Pyndiah et al. | |
| 6,119,264 A | 9/2000 | Berrou et al. | |
| 6,122,763 A | 9/2000 | Pyndiah et al. | |
| 6,374,386 B1 * | 4/2002 | Kim et al. | 714/786 |
| 6,397,367 B1 * | 5/2002 | Park et al. | 714/786 |
| 6,437,714 B1 * | 8/2002 | Kim et al. | 341/81 |
| 6,487,693 B1 * | 11/2002 | Kim et al. | 714/786 |
| 6,516,441 B1 * | 2/2003 | Kim et al. | 714/774 |
| 6,523,146 B1 * | 2/2003 | Ishikawa | 714/786 |
| 6,560,748 B2 * | 5/2003 | Li | 714/786 |
| 6,715,120 B1 * | 3/2004 | Hladik et al. | 714/755 |
| 6,766,489 B1 * | 7/2004 | Piret et al. | 714/755 |
| 6,812,873 B1 * | 11/2004 | Siohan et al. | 341/107 |
| 6,816,556 B2 * | 11/2004 | Kim | 375/265 |

(Continued)

FOREIGN PATENT DOCUMENTS

EP  0 735 696 A2  10/1996

(Continued)

OTHER PUBLICATIONS

European Search Report; EP07010406.2-1247, dated Aug. 24, 2009.

(Continued)

*Primary Examiner* — Joseph D Torres
(74) *Attorney, Agent, or Firm* — Garlick Harrison & Markison; Shayne X. Short

(57) ABSTRACT

Tail-biting turbo coding to accommodate any information and/or interleaver block size. The beginning and ending state of a turbo encoder can be made the same using a very small number of dummy bits. In some instances, any dummy bits that are added to an information block before undergoing interleaving are removed after interleaving and before transmission of a turbo coded signal via a communication channel thereby increasing throughput (e.g., those dummy bits are not actually transmitted via the communication channel). In other instances, dummy bits are added to both the information block that is encoded using a first constituent encoder as well as to an interleaved information block that is encoded using a second constituent encoder.

20 Claims, 8 Drawing Sheets

U.S. PATENT DOCUMENTS

| | | | |
|---|---|---|---|
| 6,940,928 B2 * | 9/2005 | Cameron | 375/341 |
| 6,950,977 B2 * | 9/2005 | Lavi et al. | 714/794 |
| 7,146,552 B2 * | 12/2006 | Kim et al. | 714/755 |
| RE41,498 E * | 8/2010 | Park et al. | 714/755 |
| 7,797,615 B2 * | 9/2010 | Zheng | 714/786 |

FOREIGN PATENT DOCUMENTS

| | | |
|---|---|---|
| EP | 0 735 696 A3 | 1/1999 |
| FR | 91 05278 A1 | 10/1992 |
| WO | 9946862 A1 | 9/1999 |

OTHER PUBLICATIONS

3GPP TS 25.212, "3rd Generation Partnership Project; Technical Specification Group Radio Access Network; Multiplexing and channel coding (FDD) (Release 7)", Jun. 2006, 80 pages, V7.1.0, France.

C. Berrou, Y. Saouter, C. Douillard, S. Kerouédan, and M. Jézéquel, "Designing good permutations for turbo codes: towards a single model," 2004 IEEE International Conference on Communications (ICC), vol. 1; pp. 341- 345, Jun. 20-24, 2004.

O. Y. Takeshita, "On maximum contention-free interleavers and permutation polynomials over integer rings," IEEE Trans. Information Theory, vol. 52, No. 3, Mar. 2006, pp. 1249-1253 (5 pages).

HighDimension Ltd., "System impact of Rel'6 turbo coding tail-bits removal," 3GPP TSG RAN WG1#46, R1-062157 (3 pages).

3GPP TS 25.212 V6.8.0 (Jun. 2006). 3rd Generation Partnership Project; Technical Specification Group Radio Access Network; Multiplexing and channel coding (FDD) (Release 6) (84 pages).

C. Weiβ, C. Bettstetter and S. Riedel, "Code Construction and Decoding of Parallel Concatenated Tail-Biting Codes," IEEE Transactions on Information Theory, vol. 47, No. 1, pp. 366-386, Jan. 2001.

Broadcom, "Tail-biting encoding for 3GPP LTE turbo codes of arbitrary Number of information bits and performance comparison," 3GPP TSG RAn WG1 #47bis R1-070544 (14 pages).

J. L. Massey and M. K. Sain, "Codes, automata, and continuous systems: Explicit interconnections," IEEE Trans. Automat. Contr., vol. AC-12, No. 6, pp. 644-650, 1967.

Robert J. McEliece, The Algebraic Theory of Convolutional Codes. In Handbook of Coding Theory, R. Brualdi, W.C. Human and V. Pless (eds.). Elsevier Science Publishers, Amsterdam, The Netherlands, 1998 (82 pages).

J. Rosenthal, and E. V. York, "BCH Convolutional Codes," IEEE Transactions on Information Theory, vol. 45, No. 6, pp. 1833-1842, Sep. 1999.

H. Gluesing-Luerssen and G. Schneider, "State space realizations and monomial equivalence for convolutional codes", arXiv:cs.IT/0603049 v1, Mar. 13, 2006 (17 pages).

Claude Berrou, Alain Glavieux, and Punya Thitimajshima. "Near Shannon limit error-correcting coding and decoding: turbo codes", Proc. of IEEE ICC '93, Geneva, May 1993, pp. 1064-1070.

C. Fragouli and R. Wesel, "Turbo-Encoder Design for Symbol-Interleaved Parallel Concatenated Trellis-Coded Modulation," IEEE Transactions on Communications, vol. 49, No. 3, pp. 425-435, Mar. 2001.

France Telecom, Orange, HighDimension Ltd., "Duo-Binary Turbo Codes for Evolved UTRA," 3GPP TSG RAN WG1#46, R1-061973 (10 pages).

Ericsson, Motorola, "QPP interleaver parameters," 3GPP TSG RAN WG1 #47bis R1-070484 (5 pages).

Motorola, "A contention-free interleaver design for LTE codes," 3GPP TSG RAN WG1#47 (8 pages).

Ericsson, "Performance Comparison of LTE Turbo Internal Interleaver Proposals," 3GPP TSG-RAN WG1 #47bis R1-070464 (23 pages).

A. Tarable, S. Benedetto and G. Montorsi "Mapping Interleaving Laws to Parallel Turbo and LDPC Decoder Architectures," IEEE Trans. on Information Theory, vol. 50, No. 9, pp. 2002-2009, Sep. 2004 (8 pages).

\* cited by examiner

TAIL-BITING TURBO CODING TO ACCOMMODATE ANY INFORMATION AND/OR INTERLEAVER BLOCK SIZE

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional patent applications which are hereby incorporated herein by reference in their entirety and made part of the present U.S. Utility patent application for all purposes:

1. U.S. Provisional Application Ser. No. 60/847,773, entitled "Tail-biting turbo code for arbitrary number of information bits," filed Sep. 28, 2006.
2. U.S. Provisional Application Ser. No. 60/899,191, entitled "Tail-biting turbo coding to accommodate any information and/or interleaver block size," filed Feb. 2, 2007.

INCORPORATION BY REFERENCE

The following U.S. Utility patent application is hereby incorporated herein by reference in its entirety and is made part of the present U.S. Utility patent application for all purposes:

1. U.S. Utility patent application Ser. No. 11/586,101, entitled "Tail-biting turbo code for arbitrary number of information bits," filed Oct. 25, 2006, pending.

BACKGROUND OF THE INVENTION

1. Technical Field of the Invention

The invention relates generally to communication systems; and, more particularly, it relates to communication systems employing turbo coding.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Many communication systems incorporate the use of a turbo code. While there are many potential applications that can employ turbo codes, means are presented herein that can be applied to the 3GPP channel code to support an arbitrary number of information bits. Some examples of the number of bits, though not limited thereto, that can be supported using the various aspects of the invention presented herein are 40 to 5114 for WCDMA and HSDPA and more for LTE. Alternatively, other examples of the number of bits, though not limited thereto, that can be supported using the various aspects of the invention presented herein are 40 to 6114 or 40 to 8192, or any other desirable number of bits as selected for a particular application.

Additional information regarding the UTRA-UTRAN Long Term Evolution (LTE) and 3GPP System Architecture Evolution (SAE) can be found at the following Internet web site:

www.3gpp.org

Turbo coding was suggested for 3GPP LTE channel coding. Within the channel coding system in 3GPP LTE, there is a need and desire to supply and provide for a wide range of block sizes (i.e., turbo code block lengths). For this coding system, the algebraic interleave referred to as the "almost regular permutation (ARP)" in reference [1] is considered as one of the candidates, and "quadratic polynomial permutation (QPP)" in reference [2] is considered as an alternative candidate.

Furthermore, the turbo decoding of this system generally needs to be implemented using a parallel decoding arrangement because of the very high data throughput and large block size desired for 3GPP LTE channel coding. The parallel decoding requires the collision-free memory accessing (i.e., any one turbo decoder (of a group of parallel arranged turbo decoders) accesses only memory (of a group of parallel arranged memories) at any given time).

Figure 1:
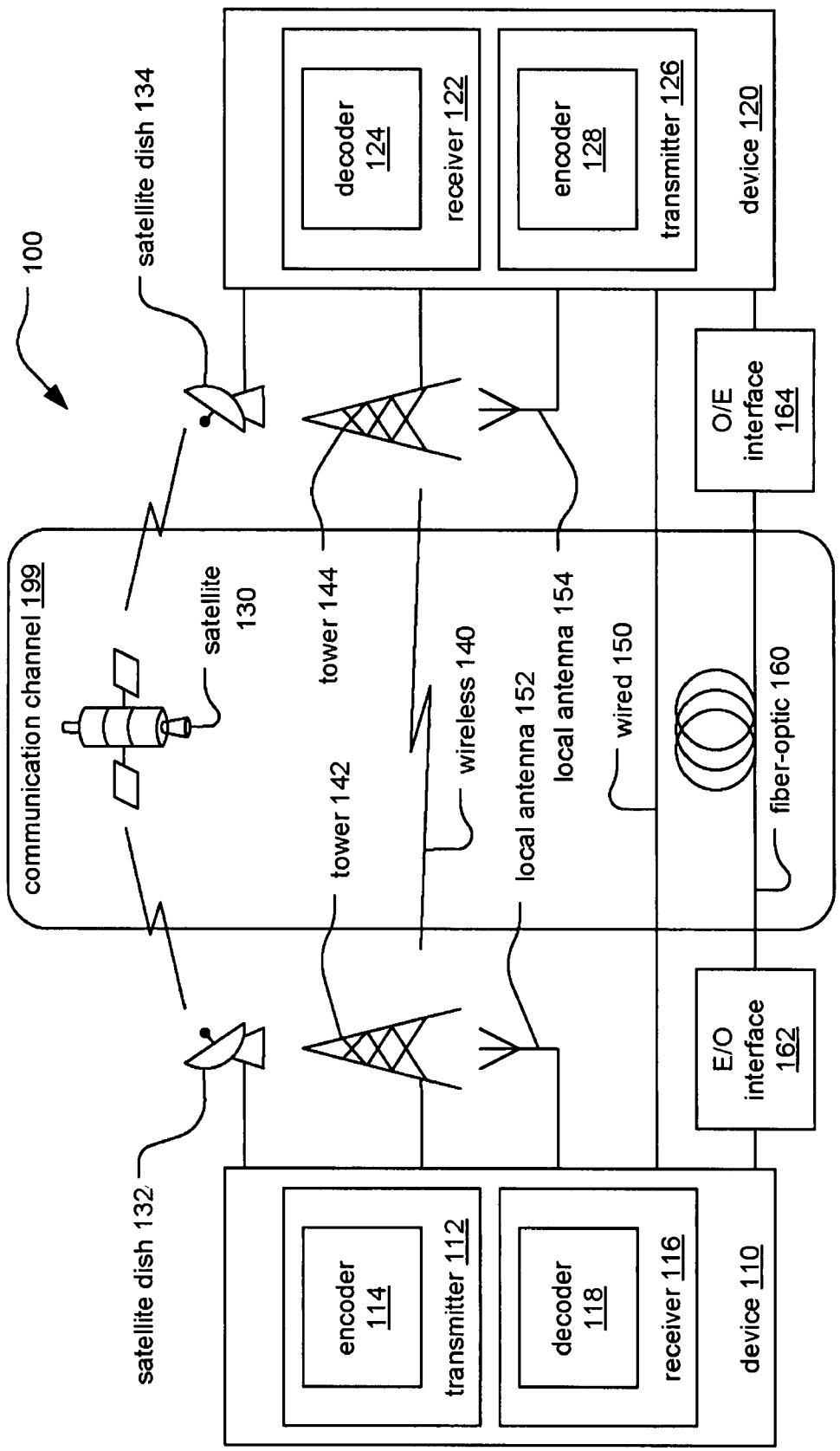
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

As mentioned above, many communication systems incorporate the use of a turbo code. When performing encoding of an input sequence within such turbo encoders, it is oftentimes desirable to ensure that the beginning and/or at least the ending state of the encoder is at a known state.

In some embodiments, the manner of implemented a turbo decoder includes using a plurality of turbo decoders arranged in a parallel implementation. For example, multiple processing modules can be employed to perform parallel turbo decoding processing.

Some means by which an encoder can be returned to a known state at the end of encoding an input sequence include:

(1) adding 2m bits outside of the interleaver of the turbo encoder for a constituent convolutional encoder having $2^\wedge \mu m$ states (where m is an integer), and (2) the means as provided in commonly assigned U.S. Pat. No. 7,085,985, entitled "Close two constituent trellis of a turbo encoder within the interleave block".

For a given input sequence, when both the first and last state of the encoder is the same, this can referred to as tail-biting. Also, with respect to decoding of turbo coded signals, forward and backward turbo decoding approaches rely on the known initial and final states of the encoder when encoding the input sequence that generates the turbo coded signal.

Tail-biting termination, which gives equal states at the beginning and the end of encoding of an input sequence, serves this purpose. A means is presented herein to perform tail-biting termination of an encoder without adding any extra terminating symbols (or bits).

While some approaches can provide for tail-biting for one particular type of turbo code having a particular input sequence block size, these approaches do provide for any means by which various block sizes can be accommodated without a nearly complete re-hauling and design to enable tail-biting. In other words, these approaches simply cannot accommodate an arbitrary number of information bits within the input sequence.

In certain applications, such as the LTE encoder, it would desirable to support arbitrary number of information bits from a consecutive range of integers (e.g. Rel.6 supports the size from 40 to 5114). As pointed out in R1-062157[3], Rel.6 turbo encoder [4] can not provide tail-biting state for $\frac{1}{7}$ of all of the possible information sequences.

Herein, it is first shown that all turbo codes have a similar problem. A detailed analysis is provided herein for selecting a tail-biting encoder from among all possible 8 states turbo codes.

In reference [5], a sufficient condition is given for an encoder being tail-biting for any information sequence with a given information block size. In reference [6], it is proved that this condition is also necessary for an encoder with minimal degree (i.e. the number of states cannot be reduced). To state this necessary and sufficient condition, the definition of state-space realization of convolutional encoder is employed herein as described in references [5 and 7-9].

With this realization a necessary and sufficient condition of a tail-biting minimal encoder, a novel means is presented herein to accommodate an information sequence of any arbitrary size.

Consider a rate $k_0/n_0$ convolutional encoder of degree m, let the input sequence be as follows:

$u=(u_0, \ldots, u_{N-1})$ where $u_i=(u_{i,k_0-1}, \ldots, u_{i,0})$ and the output sequence $x=(X_0, \ldots, x_{N-1})$ where $X_i=(x_{i,n_0-1}, \ldots, x_{i,0})x_i= (x_{i,n_0-1}, \ldots, x_{i,0})$.

Moreover, let $S_t=(S_{m-1}^{(t)}, \ldots, S_0^{(t)})$ be the encoding state at time t. Then there exits m×m matrix A, m×$k_0$ matrix B, $k_0$×m matrix C, and $k_0$×$n_0$ matrix D, which is called state-space realization of the encoder, such that $$S_t^T=(S_{m-1}^{(t)}, \ldots, S_0^{(t)})^T=A(S_{m-1}^{(t-1)}, \ldots, S_0^{(t-1)})_T+ Bu_t^T=AS_{t-1}^T Bu \quad \text{(EQ-1)}$$

and $x_t^T=CS_{t-1}^T+Du_t^T$. The generate matrix of this convolutional encoder is $$C(A,B,C,D)=G(x)=D+C(x^{-1}I_m-A)^{-1}B \quad \text{(EQ-2)}$$

Figure 6:
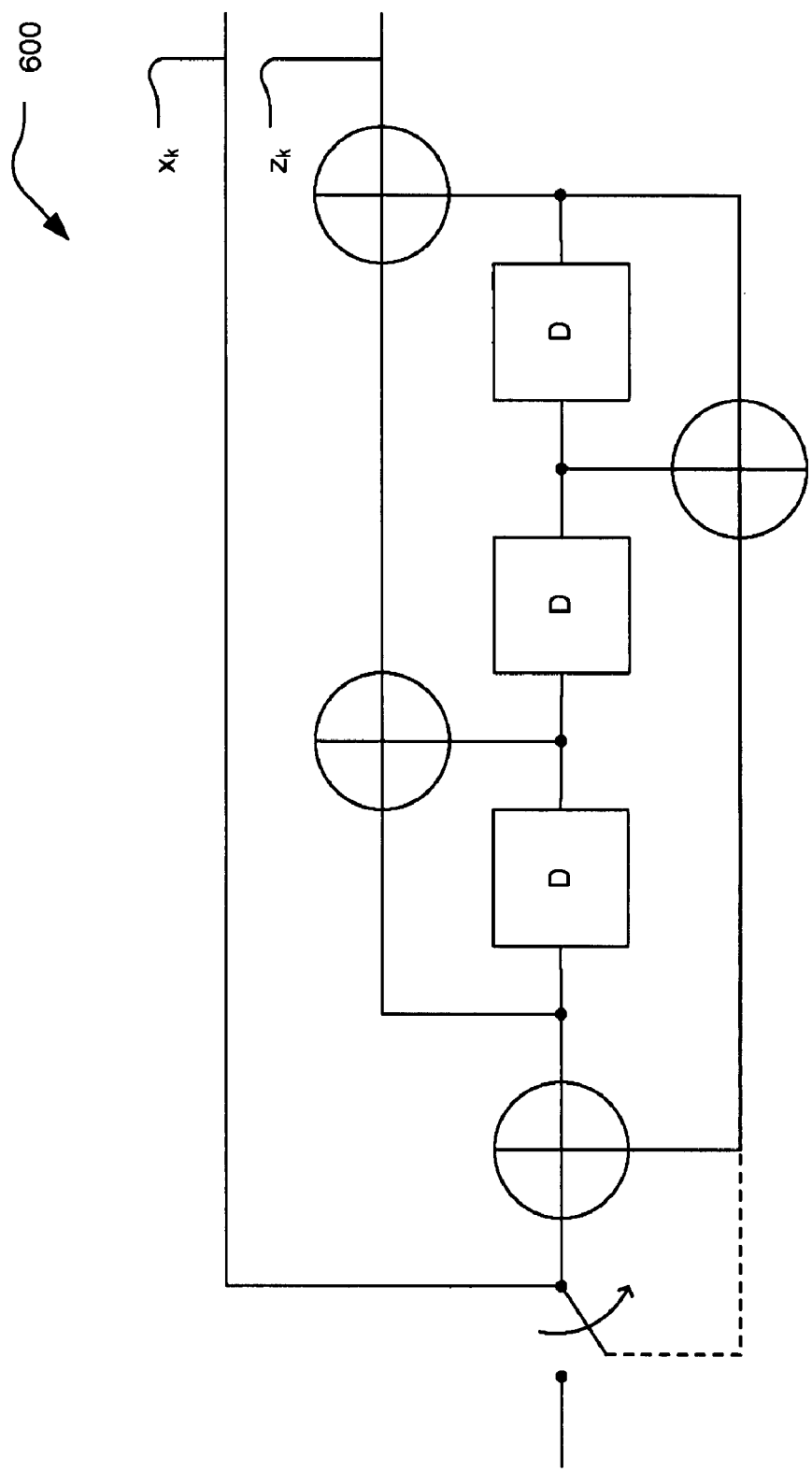
FIG. 6 illustrates an embodiment of a first constituent encoder of Rel.6 as can be implemented within a turbo encoder.

FIG. 6 illustrates an embodiment 600 of a first constituent encoder of Rel.6 as can be implemented within a turbo encoder.

Example 1

Consider convolutional encoder in Rel.6 turbo code depicted in FIG. 6. The encoder has minimal degree 3 and $S_0^t = S_2^{t-1} + S_1^{t-1} + u_t$, $S_0^{t-1} = S_0^{t-1}$, $S_2^t = S_1^{t-1}$. Thus, its 4 state matrices are as follows:

$$A = \begin{bmatrix} 0 & 1 & 0 \\ 0 & 0 & 1 \\ 1 & 1 & 0 \end{bmatrix}, B = \begin{bmatrix} 0 \\ 0 \\ 1 \end{bmatrix}, C = \begin{bmatrix} 1 & 0 & 1 \\ 0 & 0 & 0 \end{bmatrix}, D = \begin{bmatrix} 1 \\ 1 \end{bmatrix}$$

Again, in [5], a sufficient condition is given for an encoder being tail-biting for any information sequence with a given block size. In the following, we prove this condition is necessary for an encoder with minimal degree (i.e. the number of states cannot be reduced).

Theorem 1 Let the matrices (A, B, C, D) be the state-space realization of a convolutional encoder with minimal degree m. This encoder is tail-biting for any information sequence of block size $N \geq m$ if and only if $A^N + I_m$ is invertible.

Nonexistence of Tail-Biting States for any Turbo Code

Theorem 2 Given any turbo encoder E with minimal degree of constituent encoders, there exists a positive integer P such that, E gives no tail-biting termination for some information sequences of size tP (t>0).

Details related to Theorem 2 are also provided in references [10, 11].

Based on Theorem 2 there is no need to choose other turbo code for tail-biting purpose.

8 States (m=3) Turbo Codes

In this section we investigate all possible degree 3 convolutional encoders for turbo code and try to find which one is best for tail-biting. Let us recall the definition of similarity of two m×m matrices. Two m×m matrices $A_1$ and $A_2$ are said similar if there exists a invertible matrix S such that $A_1 = SA_2S^{-1}$. It is easy to prove that code with state-space realization (A, B, C, D) and ($SAS^{-1}$, SB, $CS^{-1}$, D) have the same encoder matrix G(x) (also see reference [12]).

The set of all 3×3 binary matrices can be partitioned into several classes such that every class contains all similar matrices. Those classes also can be divided to 3 big categories, namely: (1) classes with nilpotent matrix, (2) classes with non-invertible and non-nilpotent, and (3) classes with invertible matrices. In fact, there are 14 classes. Therefore, we only need to consider 14 matrices that are representative of each class.

(1) Nilpotent (3 Representatives)

$$A_1 = \begin{bmatrix} 0 & 0 & 0 \\ 0 & 0 & 0 \\ 0 & 0 & 0 \end{bmatrix}, A_2 = \begin{bmatrix} 0 & 1 & 0 \\ 0 & 0 & 0 \\ 0 & 0 & 0 \end{bmatrix}, A_3 = \begin{bmatrix} 0 & 1 & 0 \\ 0 & 0 & 1 \\ 0 & 0 & 0 \end{bmatrix}$$

Obviously, these matrices are none recursive and will not be considered as a constituent encoder of turbo code.

(2) Non-Invertible and Non-Nilpotent (5 Representatives)

$$A_4 = \begin{bmatrix} 1 & 0 & 0 \\ 0 & 0 & 0 \\ 0 & 0 & 0 \end{bmatrix}, A_5 = \begin{bmatrix} 0 & 1 & 0 \\ 1 & 0 & 0 \\ 0 & 0 & 0 \end{bmatrix},$$

$$A_6 = \begin{bmatrix} 1 & 1 & 0 \\ 1 & 0 & 0 \\ 0 & 0 & 0 \end{bmatrix}, A_7 = \begin{bmatrix} 1 & 0 & 0 \\ 0 & 1 & 0 \\ 0 & 0 & 0 \end{bmatrix}$$

Encoder with these 4 state matrices will give a disconnected memory. The encoder with disconnected memory will not give the best $d_2$ needed by turbo codes [12].

$$A_8 = \begin{bmatrix} 1 & 1 & 0 \\ 0 & 0 & 1 \\ 0 & 0 & 0 \end{bmatrix} \to A_8^t = \begin{bmatrix} 1 & 1 & 1 \\ 0 & 0 & 0 \\ 0 & 0 & 0 \end{bmatrix}, t > 1 \to A_8^t + I_3 = \begin{bmatrix} 0 & 1 & 0 \\ 0 & 1 & 1 \\ 0 & 0 & 1 \end{bmatrix}$$

Since $A_8^3 + I_3$ is non-invertible, according to Theorem 1 the encoder (A, B, C, D) either is not minimal degree or it is not tail-biting for some information sequences. For examples, a) take $B = [1\ 1\ 1]^T$ we have $BA = [0\ 1\ 0]^T$ and $BA^2 = [1\ 0\ 1]^T$. Then (EQ-3) has no solution for many information sequences of size >2; b) take $B = [1\ 1\ 0]^T$, then the encoder can be reduced to a degree 2 encoder (A',B',C',D) with $$A' = \begin{bmatrix} 1 & 1 \\ 0 & 1 \end{bmatrix} \text{ and } B' = \begin{bmatrix} 1 \\ 1 \end{bmatrix}.$$

(3) Invertible (6 Representatives)

$A_9 = I_3$ which gives a disconnected memory encoder.

$$A_{10} = \begin{bmatrix} 0 & 0 & 1 \\ 0 & 1 & 0 \\ 1 & 0 & 0 \end{bmatrix} \to A_{10}^2 = I_3 A_{11} = \begin{bmatrix} 1 & 0 & 1 \\ 0 & 1 & 0 \\ 1 & 0 & 0 \end{bmatrix} \to A_{11}^3 = I_3$$

The encoders with these matrices have disconnected memory.

$$A_{12} = \begin{bmatrix} 0 & 1 & 0 \\ 1 & 0 & 1 \\ 1 & 0 & 0 \end{bmatrix} \to A_{12}^4 = I_3, A_{12}^2 + I = \begin{bmatrix} 0 & 0 & 1 \\ 0 & 0 & 1 \\ 0 & 0 & 0 \end{bmatrix},$$

$$A_{12}^3 + I = \begin{bmatrix} 1 & 1 & 1 \\ 1 & 1 & 0 \\ 0 & 0 & 0 \end{bmatrix}$$

$$A_{13} = \begin{bmatrix} 0 & 1 & 0 \\ 0 & 0 & 1 \\ 1 & 1 & 0 \end{bmatrix} \to A_{13}^7 = I, A_{13}^1 + I_3 = \begin{bmatrix} 1 & 1 & 0 \\ 0 & 1 & 1 \\ 1 & 1 & 1 \end{bmatrix}$$

The turbo code of Rel.6 uses convolutional encoder with $A_{13}$ as a state matrix. Further more we have $$A_{13}^2 = \begin{bmatrix} 0 & 0 & 1 \\ 1 & 1 & 0 \\ 0 & 1 & 1 \end{bmatrix}, A_{13}^2 + I_3 = \begin{bmatrix} 1 & 0 & 1 \\ 1 & 0 & 0 \\ 0 & 1 & 0 \end{bmatrix},$$

$$A_{13}^3 = \begin{bmatrix} 1 & 1 & 0 \\ 0 & 1 & 1 \\ 1 & 1 & 1 \end{bmatrix}, A_{13}^3 + I_3 = \begin{bmatrix} 0 & 1 & 0 \\ 0 & 0 & 1 \\ 1 & 1 & 0 \end{bmatrix},$$

$$A_{13}^4 = \begin{bmatrix} 0 & 1 & 1 \\ 1 & 1 & 1 \\ 1 & 0 & 1 \end{bmatrix}, A_{13}^4 + I_3 = \begin{bmatrix} 1 & 1 & 1 \\ 1 & 0 & 1 \\ 1 & 0 & 0 \end{bmatrix},$$

-continued $$A_{13}^5 = \begin{bmatrix} 1 & 1 & 1 \\ 1 & 0 & 1 \\ 1 & 0 & 0 \end{bmatrix}, A_{13}^5 + I_3 = \begin{bmatrix} 0 & 1 & 1 \\ 1 & 1 & 1 \\ 1 & 0 & 1 \end{bmatrix},$$

$$A_{13}^6 = \begin{bmatrix} 1 & 0 & 1 \\ 1 & 0 & 0 \\ 0 & 1 & 0 \end{bmatrix}, A_{13}^6 + I_3 = \begin{bmatrix} 0 & 0 & 1 \\ 1 & 1 & 0 \\ 0 & 1 & 1 \end{bmatrix}$$

$$A_{14} = \begin{bmatrix} 0 & 1 & 0 \\ 0 & 0 & 1 \\ 1 & 0 & 1 \end{bmatrix} \rightarrow A_{14}^7 = I_3, A_{14}^1 + I_3 = \begin{bmatrix} 1 & 1 & 0 \\ 0 & 1 & 1 \\ 1 & 0 & 0 \end{bmatrix},$$

Figure 7:
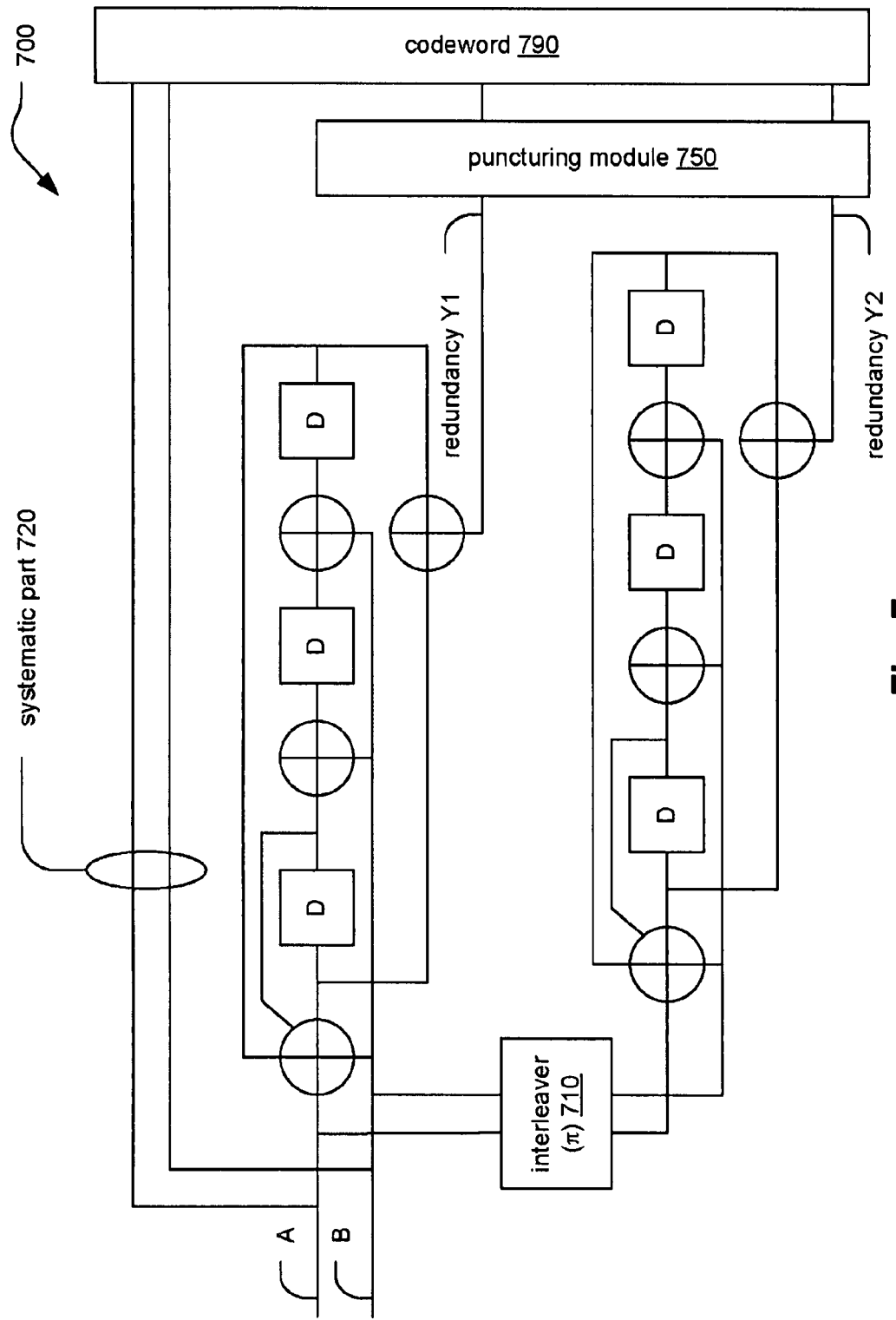
FIG. 7 illustrates an embodiment of a duo-binary turbo encoder.

FIG. 7 illustrates an embodiment of a duo-binary turbo encoder 700. The Duo-binary turbo code [13] uses $A_{14}$ as its constituent encoder shown within the duo-binary turbo encoder 700.

Moreover, we have $$A_{14}^2 = \begin{bmatrix} 0 & 0 & 1 \\ 1 & 0 & 1 \\ 1 & 1 & 1 \end{bmatrix}, A_{14}^2 + I_3 = \begin{bmatrix} 1 & 0 & 1 \\ 1 & 1 & 1 \\ 1 & 1 & 0 \end{bmatrix},$$

$$A_{14}^3 = \begin{bmatrix} 1 & 0 & 1 \\ 1 & 1 & 1 \\ 1 & 1 & 0 \end{bmatrix}, A_{14}^3 + I_3 = \begin{bmatrix} 0 & 0 & 1 \\ 1 & 0 & 1 \\ 1 & 1 & 1 \end{bmatrix},$$

$$A_{14}^4 = \begin{bmatrix} 1 & 1 & 1 \\ 1 & 1 & 0 \\ 0 & 1 & 1 \end{bmatrix}, A_{14}^4 + I_3 = \begin{bmatrix} 0 & 1 & 1 \\ 1 & 0 & 0 \\ 0 & 1 & 0 \end{bmatrix},$$

$$A_{14}^5 = \begin{bmatrix} 1 & 1 & 0 \\ 0 & 1 & 1 \\ 1 & 0 & 0 \end{bmatrix}, A_{14}^5 + I_3 = \begin{bmatrix} 0 & 1 & 0 \\ 0 & 0 & 1 \\ 1 & 0 & 1 \end{bmatrix},$$

$$A_{14}^6 = \begin{bmatrix} 0 & 1 & 1 \\ 1 & 0 & 0 \\ 0 & 1 & 0 \end{bmatrix}, A_{14}^6 + I_3 = \begin{bmatrix} 1 & 1 & 1 \\ 1 & 1 & 0 \\ 0 & 1 & 1 \end{bmatrix}$$

Furthermore, we can have the following proposition.

Proposition 1 Let $A = A_{13}$ or $A_{14}$. Then for any positive integer $n=7q+i$, $0 \leq i \leq 6$ $$A^n + I_m = A^i + I_m = \begin{cases} 0 & i = 0 \\ \text{invertible} & i \neq 0 \end{cases}$$

We may extend Proposition 1 to the following.

Proposition 2 Let $m=2, 3, 4, 5, 6$. There exists an $m \times m$ binary matrix $A$ such that $A^{2^m-1} = I_m$. Moreover, for any such matrix $A$ and any positive integer $n=pq+i$, $0 \leq i \leq p-1$, where $p=2^m-1$, $$A^n + I_m = A^i + I_m = \begin{cases} 0 & i = 0 \\ \text{invertible} & i \neq 0 \end{cases}$$

Thus, by this proposition and Theorem 1, there always exists a turbo code of state $2^m$ ($m=2, 3, 4, 5, 6$) such that any information sequence of size not a multiple of $p=2^m-1$ can be tail-biting encoded by this turbo encoder. Analogously, any information sequence of size not a multiple of 7 can be tail-biting encoded by the turbo encoder in Rel.6.

Tail-Biting Termination for Arbitrary Number of Information Bits with a Turbo Code a Given Interleave ($\pi$)

In the following, we firstly describe the re-loaded procedures. These procedures are done once and the results are stored. Here we only give the method for the turbo code of constraint size $m+1$ with $m=3$ for simplicity. For the case $m=2$ and $m>3$ the method is similar.

Let $(A, B, C, D)$ be state space realization of the 8 states convolutional encoder with A being similar to either $A_{13}$ or $A_{14}$ listed in the last section.

(1) Pre-compute the followings states for $i=1, 2, 3, 4, 5, 6$.

$$S_{i,1} = (A^i + I_3)^{-1} \begin{bmatrix} 0 \\ 0 \\ 1 \end{bmatrix}, S_{i,2} = (A^i + I_3)^{-1} \begin{bmatrix} 0 \\ 1 \\ 0 \end{bmatrix},$$

$$S_{i,3} = (A^i + I_3)^{-1} \begin{bmatrix} 0 \\ 1 \\ 1 \end{bmatrix}, S_{i,4} = (A^i + I_3)^{-1} \begin{bmatrix} 1 \\ 0 \\ 0 \end{bmatrix},$$

$$S_{i,5} = (A^i + I_3)^{-1} \begin{bmatrix} 1 \\ 0 \\ 1 \end{bmatrix}, S_{i,6} = (A^i + I_3)^{-1} \begin{bmatrix} 1 \\ 1 \\ 0 \end{bmatrix},$$

$$S_{i,7} = (A^i + I_3)^{-1} \begin{bmatrix} 1 \\ 1 \\ 1 \end{bmatrix}$$

(2) Pre-store the above 42 index-state pairs as a look-up-table $LT(i, b_{(2)}) = S_{i,b}$, where $b=1, 2, 3, 4, 5, 6, 7$ and $b_{(2)}$ is the 3 bits binary representation of b. Moreover, let $LT(i,0)=0$ state.

We now start describing the encoding procedure. Considering a turbo encoder that enables tail-biting when the interleave size is not a multiple of P.

To encode an information stream with a given interleave, the size of information stream (L) must be less or equal to the size of interleave (N), i.e. $N \geq L$. To encode such information stream, two major methods are available, namely pruning and puncturing.

Case 1 (Pruning)

Figure 2:
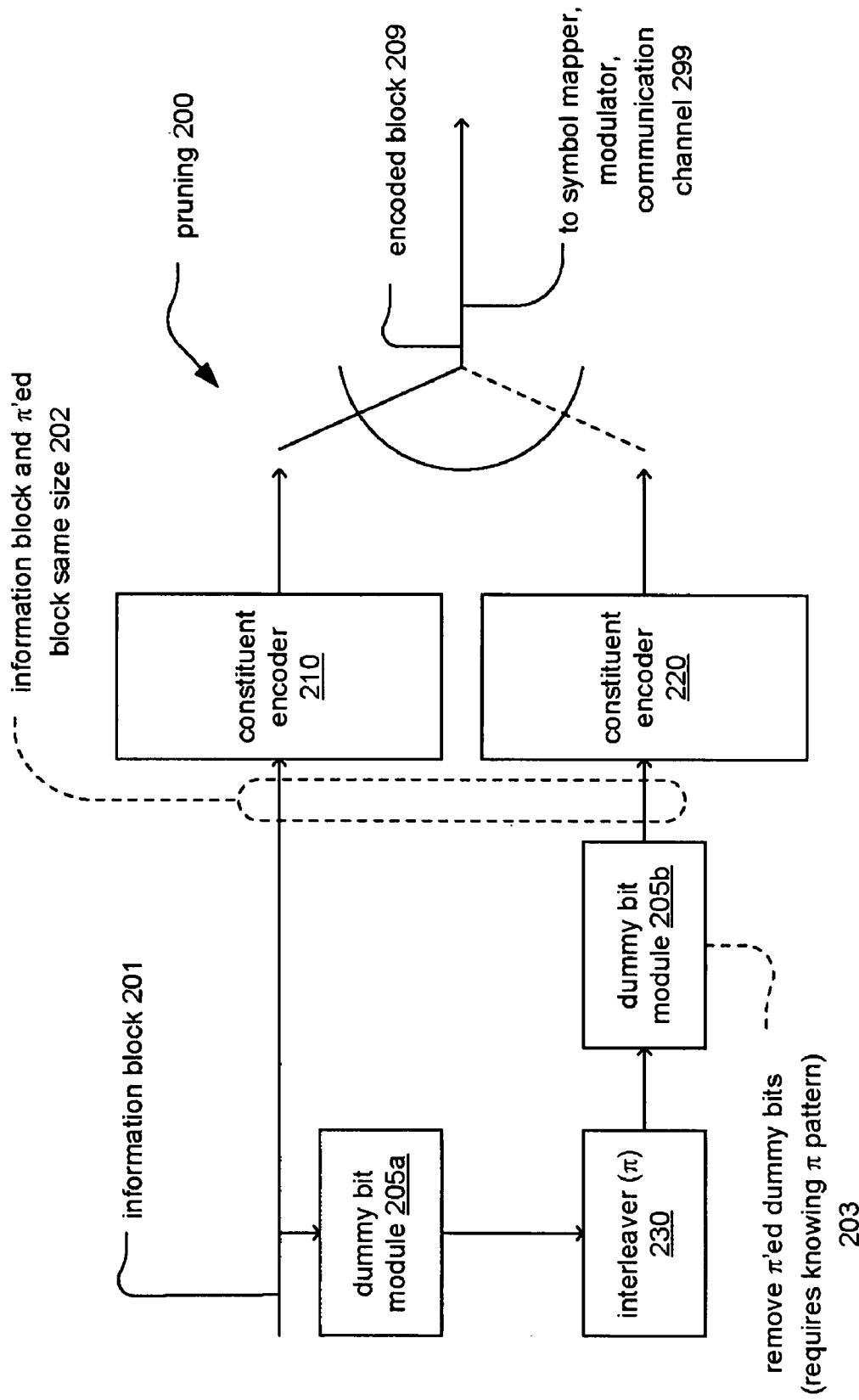
FIG. 2 illustrates an embodiment of a turbo encoder employing pruning tail-biting.

FIG. 2 illustrates an embodiment of a turbo encoder 200 employing pruning tail-biting. An information block 201, which includes at least one information bit, is provided to a dummy bit module 205$a$ and also to a first constituent encoder 210. If the information block size is not the same as the interleaver ($\pi$) block size employed within the turbo encoder 200, then based on a size of the information block 201, the dummy bit module 205$a$ is operable to add a small number of dummy bits to the information block 201 to ensure that a modified information block size is the same size as the interleaver ($\pi$) block size. If the information block size is in fact the same as the interleaver ($\pi$) block size employed within the turbo encoder 200, then the information block 201 is merely passed through the dummy bit module 205$a$ without undergoing any modification.

In either case, the dummy bit module 205$a$ is operable to ensure that a modified information block size is the same size as the interleaver ($\pi$) block size.

The information block 201 (or modified information block), which is then output from the dummy bit module 205$a$ after any dummy bits have been selectively added thereto, is provided to a bottom path of the turbo encoder 200 that includes an interleaver ($\pi$) 230. An unmodified version of the information block 201 is provided to a top path of the turbo encoder 200.

The top path includes the first constituent encoder 210, and the bottom path includes the interleaver ($\pi$) 230 communicatively coupled to a second constituent encoder 220. In the bottom path, after the information block 201 (or modified information block) has undergone interleaving within the interleaver ($\pi$) 230, then the now-interleaved information block (or modified and now-interleaved information block) is passed to a dummy bit module 205b in which the dummy bits are removed as shown by reference numeral 203. This requires, of course, knowing the interleaver ($\pi$) pattern of the interleaver ($\pi$) 230, so that the appropriate locations of the interleaved dummy bits can be found. As can be seen, the size of the information block provided to the first constituent encoder 210 is the same size as the interleaved ($\pi$'ed) block size that is provided from the dummy bit module 205b to the second constituent encoder 220, as indicated by reference numeral 202.

The outputs from the top and bottom paths (e.g., from the first constituent encoder 210 and the second constituent encoder 220) are alternatively selected to form an encoded block 209. The encoded block 209 (e.g., the symbols included therein) may then be passed to a symbol mapper where the symbols are mapped according to the appropriate modulation (constellation and mapping). These symbol mapped symbols may then undergo any appropriate modulation as required to generate a continuous-time signal whose format comports with a communication channel into which the turbo coded signal is to be launched.

Also, it is noted that the dummy bit modules described above, as well as any module, processing module, processing block, or other functional block described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Such a module, processing module, processing block, or other functional block described herein can be coupled to a memory. The memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory stores, and the processing module executes, operational instructions corresponding to at least some of the steps and/or functions illustrated herein.

Consider an information bits stream with block size L less than the given the size of interleave size N, i.e. N>L. Then the dummy bits are padded for k=L, L+1, ..., N−1. Then, an interleaver of size N is used to interleave the information sequence with the padded bits. After the interleaving, dummy bits are pruned away from the output of the interleaved bits (e.g., in dummy bit module 205b). Therefore, both convolution encoders of the turbo code (e.g., the first constituent encoder 210 and the second constituent encoder 220) encode the information bits without padded dummy bits.

As explained above, using the pruning technique the size of bit streams sent to both of the constituent encoders of the turbo encoder is the size of the bit stream that is sent to the interleaver ($\pi$). To ensure tail-biting encoding is performed to this stream, the size of this stream should not be multiple of P. To guarantee this, the Case 1) can be further partitioned into the following 2 cases.

Case 1.1) The Size of the Information Stream L is not a Multiple of P.

In this case, the information stream and the interleaved and pruned information stream shall be sent to each of the two constituent encoders, respectively.

Case 1.2) The size of the Information Stream L is a Multiple of P and L≦N−1 (e.g., Where N is the Interleave Size).

In this case, we first modify the information stream by adding one 0 bit at the end thereof, and the new stream is referred to as a modified information stream. The modified information stream has size L'=L+1≦N and L' is not multiple of P. Therefore, one can encode the modified information stream as described above in the Case 1.1).

Case 1.3) The Size of the Information Stream L is a Multiple of P and L=N.

In this case, no pruning technique is needed. However, two extra bits should be sent to turbo encoder, one bit of each of the constituent encoders. To the top or first constituent encoder, the extra be shall be sent after all information bits are sent. To the bottom or second constituent encoder, the extra bit shall be sent after all the interleaved information bits are sent. Obviously, the actual size of stream sent to both constituent encoders is N+1, and this is not multiple of P.

Case 2 (Puncturing)

Figure 3:
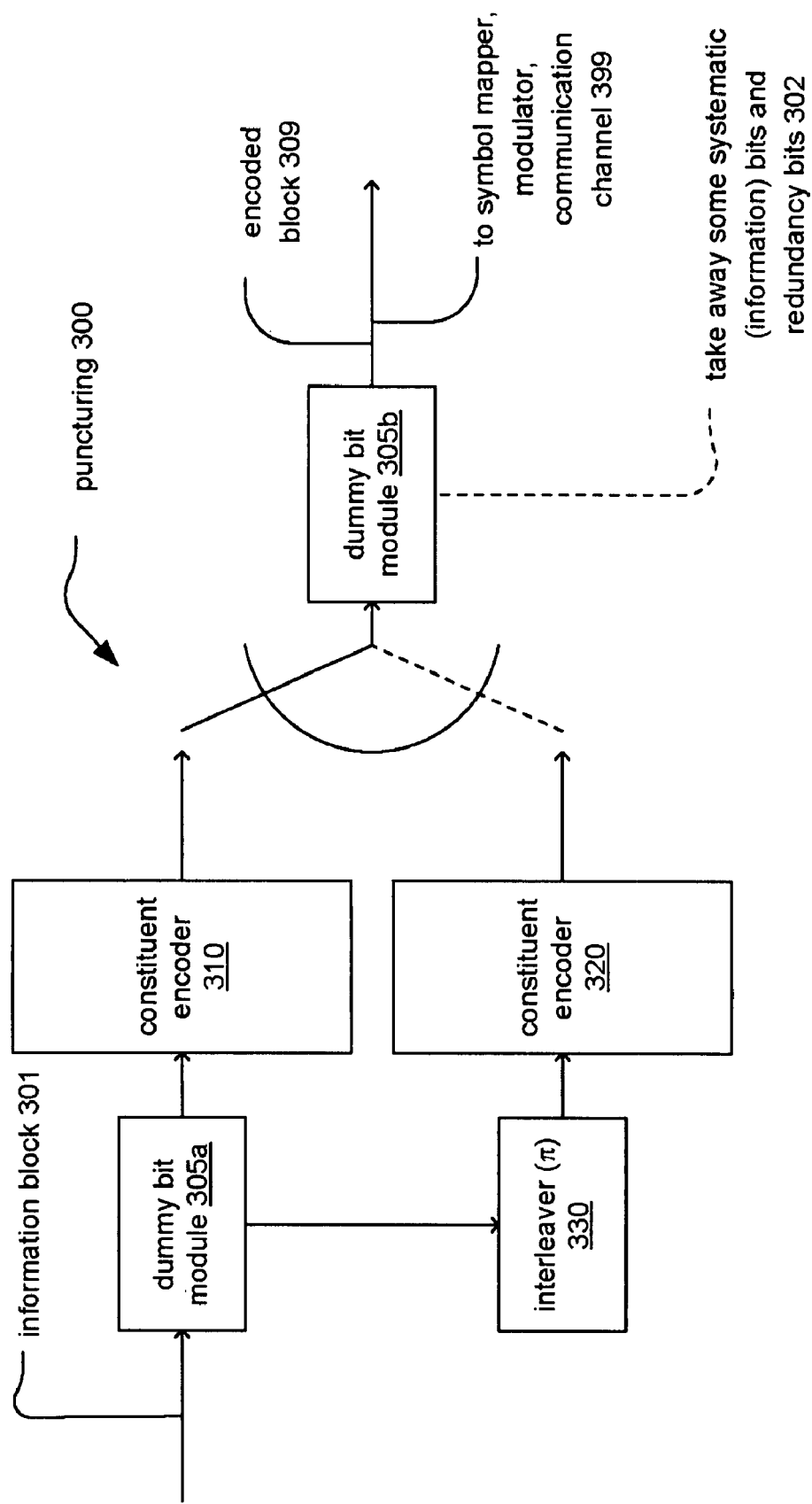
FIG. 3 illustrates an embodiment of a turbo encoder employing puncturing tail-biting.

FIG. 3 illustrates an embodiment of a turbo encoder 300 employing puncturing tail-biting.

According to the puncturing methods proposed in references [15-16], if the information block size L is less than the given the size of interleave size N, i.e. N>L. pad N-L dummy bits (e.g., 0 bits) at the beginning of the information sequence. Then, turbo encoder will encode the padded information sequence and its interleaved sequence. There are two methods for after encoding processor, namely a) [15] after encoding puncture the padded systematic bits and their check bits obtained from the non-interleaved information sequence. The check bits of the padded bits from interleaved information sequence will not be punctured. This will cause some rate loss; b) [15-16] after encoding, puncture the padded systematic bits and their check bits obtained from both the non-interleaved information sequence and the interleaved information sequence. This will not cause a rate loss but will result in a performance loss (e.g., higher bit error rate (BER)).

As discussed above, by using this puncturing technique, the size of bit streams sent to the turbo encoder is the size of the interleave. Therefore, to ensure the tail-biting encoding the size of the stream sent to turbo encoder must not be a multiple of P. To guarantee this, we can also further separate Case 2) to the following 2 cases.

Case 2.1) The Interleave Size N is not Multiple of P.

In this case, one just sends the padded stream and the interleaved padded stream to each of the top/first and bottom/second constituent encoders, respectively.

Case 2.2) The Interleave Size N is Multiple of P.

In this case, two extra bits should be sent to turbo encoder, one bit of each of the constituent encoders.

Let as label the information stream that includes the padded bits based on the puncturing technique the modified information stream (MF stream). Then, to the top constituent encoder, an extra bit shall be sent after the MF stream is sent. To the bottom constituent encoder, the extra bit shall be sent after all of the interleaved MF stream is sent. Obviously, the actual size of stream sent to both constituent encoders is N+1, and this is not multiple of P.

After the processing is performed using either of the pruning and puncturing techniques, the modified information sequence $u_0, u_1, \ldots, u_{n-1}$ of size n (n is not a multiple of P) will be sent to the top constituent encoder and the modified interleaved information sequence $v_0, v_1, \ldots, v_{n-1}$ of size n will be sent to the bottom constituent encoder. The encoding procedure can now be described as follows:

(1) With $S_{initial}$ state (e.g., use 0 state in some embodiments) encoding symbols $u_0, u_1, \ldots, u_{n-1}$ with top constituent encoder, and encoding symbols $v_0, v_1, \ldots, v_{n-1}$ with the bottom constituent encoder to find the final state $S_{final}$ of the top constituent encoder and $S_{final}'$ of the bottom constituent encoder, but do not store the encoded symbols. Then use Look-up table (LUT) to find the initial state $S_0 = LT(M, S_{final} - A^M S_{initial})$ (or $S_0' = LT(M, S_{final}' - A^M S_{final}')$). If desired in some embodiments, $S_{initial}$ state can be selected to be 0.

(2) Use $S_0$ as initial state to encode $u_0, u_1, \ldots, u_{n-1}$ with the top constituent encoder and use $S_0'$ to encode $v_0, v_1, \ldots, v_{n-1}$ with the bottom constituent encoder.

An information block 301, which includes at least one information bit, is provided to a dummy bit module 305a. If the information block size is not the same as the interleaver (π) block size employed within the turbo encoder 300, then based on a size of the information block 301, the dummy bit module 305a is operable to add a small number of dummy bits to the information block 301 to ensure that a modified information block size is the same size as the interleaver (π) block size. If the information block size is in fact the same as the interleaver (π) block size employed within the turbo encoder 300, then the information block 301 is merely passed through the dummy bit module 305a without undergoing any modification.

The information block 301 (or modified information block), which is then output from the dummy bit module 305a after any dummy bits have been selectively added thereto, is provided to a bottom path of the turbo encoder 300 that includes an interleaver (π) 330. This same information block 301 (or modified information block), which is then output from the dummy bit module 305a after any dummy bits have been selectively added thereto, is also provided to a top path of the turbo encoder 300.

The top path includes a first constituent encoder 310, and the bottom path includes the interleaver (π) 330 communicatively coupled to a second constituent encoder 320. In the bottom path, after the information block 301 (or modified information block) has undergone interleaving within the interleaver (π) 330, then the now-interleaved information block (or modified and now-interleaved information block) is passed directly to a second constituent encoder 320. In contradistinction to the previous embodiment, the now-interleaved information block (or modified and now-interleaved information block) is not passed to any additional dummy bit module in which the dummy bits are removed. As can be seen in this embodiment as with the previous embodiment, the size of the information block provided to the first constituent encoder 310 is the same size as the interleaved (π'ed) block size that is provided from the interleaver (π) 330 to the second constituent encoder 320.

The outputs from the top and bottom paths (e.g., from the first constituent encoder 310 and the second constituent encoder 320) are alternatively selected and subsequently provided to a dummy bit module 305b that is operable to take away some of the systematic (information) bits and redundancy bits, as indicated by the reference numeral 302.

After undergoing the processing within the dummy bit module 305b, an encoded block 309 is generated and output there from. The encoded block 309 (e.g., the symbols included therein) may then be passed to a symbol mapper where the symbols are mapped according to the appropriate modulation (constellation and mapping). These symbol mapped symbols may then undergo any appropriate modulation as required to generate a continuous-time signal whose format comports with a communication channel into which the turbo coded signal is to be launched.

Tail-Biting Turbo Encoding that Avoids Multiple of 'P' Interleave (π)

Figure 4:
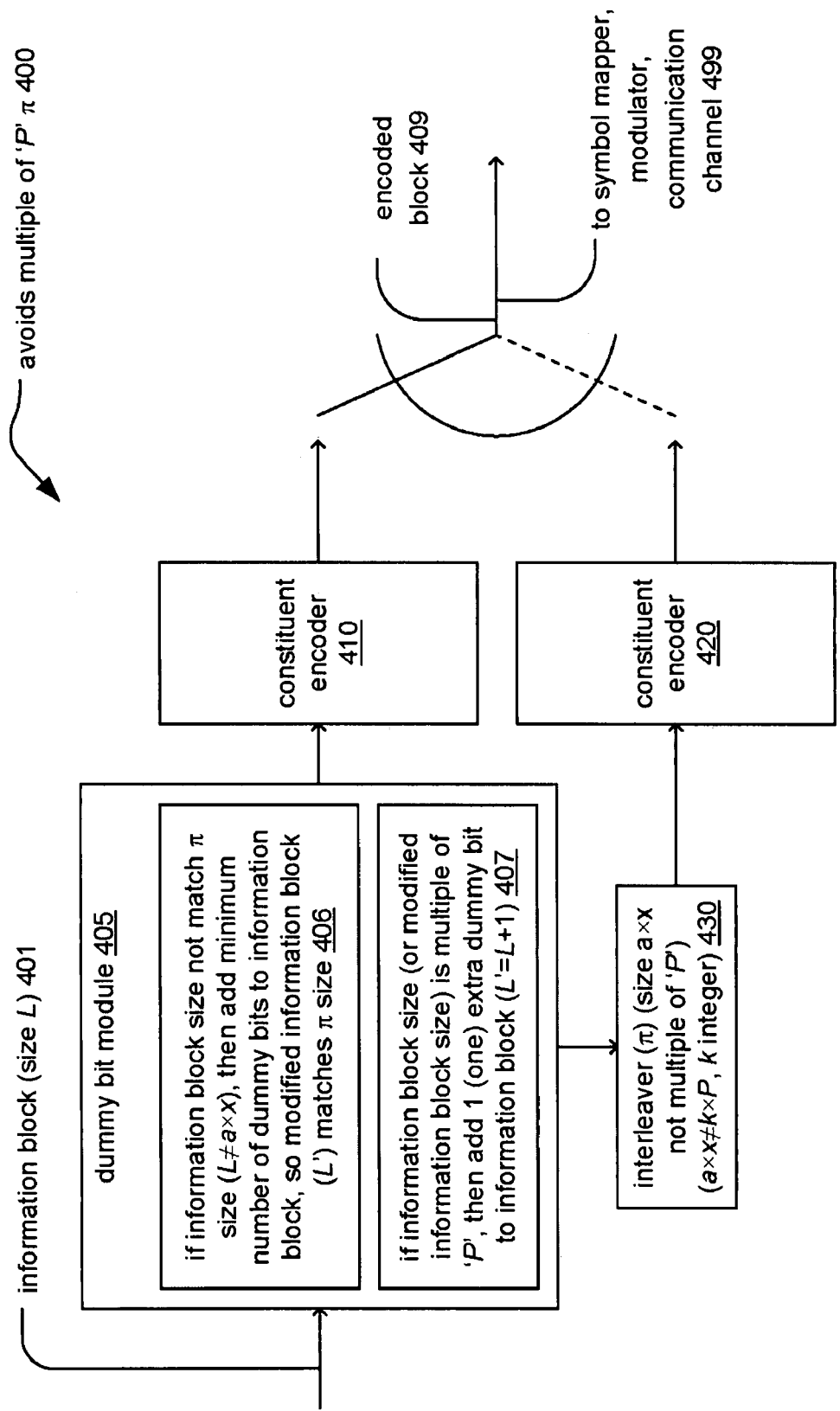
FIG. 4 illustrates an embodiment of a turbo encoder employing tail-biting that avoids a multiple of 'P' interleaver ($\pi$).

FIG. 4 illustrates an embodiment of a turbo encoder 400 employing tail-biting that avoids a multiple of 'P' interleaver (π). In this embodiment, an information block 401 (of size L), which includes at least one information bit, is provided to a dummy bit module 405. The dummy bit module 405 selectively performs one (or possibly both) of two operations, depending on certain conditions. It is noted that an interleaver (π) 430 is also employed within the turbo encoder 400 that has a block size of a×x. In this instance, the interleaver block size of a×x is specified for the turbo decoder 400. It is also noted that interleaver size of a×x is not a multiple of 'P'. It is also noted that the greatest common denominator between P and a is 1 (i.e., gcd(a,P)=1). In the Rel.6, the value of P is 7, but it could be another value in another embodiment.

As shown in a block 406, if the information block size (L) does not match the interleave block size (a×x), then the dummy bit module 405 is operable to add a minimum number of dummy bits to the information block to generate a modified information block of size L' so that the modified information block (L') matches the interleaver block size of a×x. In addition, as shown in a block 407, if either the original information block (L) 401 or the modified information block (L') is a multiple of 'P', then one (1) extra dummy bit is also added to (e.g., at the beginning of) the information block (e.g., a block of size L'=L+1 is provided to the interleaver (π) 430 in this instance) or the modified information block (e.g., a block of size L"=L'+1 is provided to the interleaver (π) 430 in this instance).

The information block 401 (or modified information block), which is then output from the dummy bit module 405 after any dummy bits have been selectively added thereto, is simultaneously provided to a top path that includes a first constituent encoder 410 and to a bottom path of the turbo encoder 400 that includes the interleaver (π) 430.

The top path includes the first constituent encoder 410, and the bottom path includes the interleaver (π) 430 communicatively coupled to a second constituent encoder 420. In the bottom path, after the information block 401 (or modified information block) has undergone interleaving within the interleaver (π) 430, then the now-interleaved information block (or modified and now-interleaved information block) is passed directly to a second constituent encoder 420. As can be seen in this embodiment, the size of the information block provided to the first constituent encoder 410 is the same size as the interleaved (π'ed) block size that is provided from the interleaver (π) 430 to the second constituent encoder 420.

The outputs from the top and bottom paths (e.g., from the first constituent encoder 410 and the second constituent encoder 420) are alternatively selected and subsequently form an encoded block 409. The encoded block 409 (e.g., the symbols included therein) may then be passed to a symbol mapper where the symbols are mapped according to the appropriate modulation (constellation and mapping). These symbol mapped symbols may then undergo any appropriate modulation as required to generate a continuous-time signal whose format comports with a communication channel into which the turbo coded signal is to be launched.

In this embodiment, as within other embodiments, one can use $S_0$ (or $S_0'$) as initial state to encode $u_0, u_1, \ldots, u_{L-1}$ (or interleaved symbols $u_{\pi(0)}, u_{\pi(1)}, \ldots, u_{\pi(L-1)}$.

Tail-Biting Turbo Encoding with Adding Extra Bit Outside of the Interleave ($\pi$)

Figure 5:
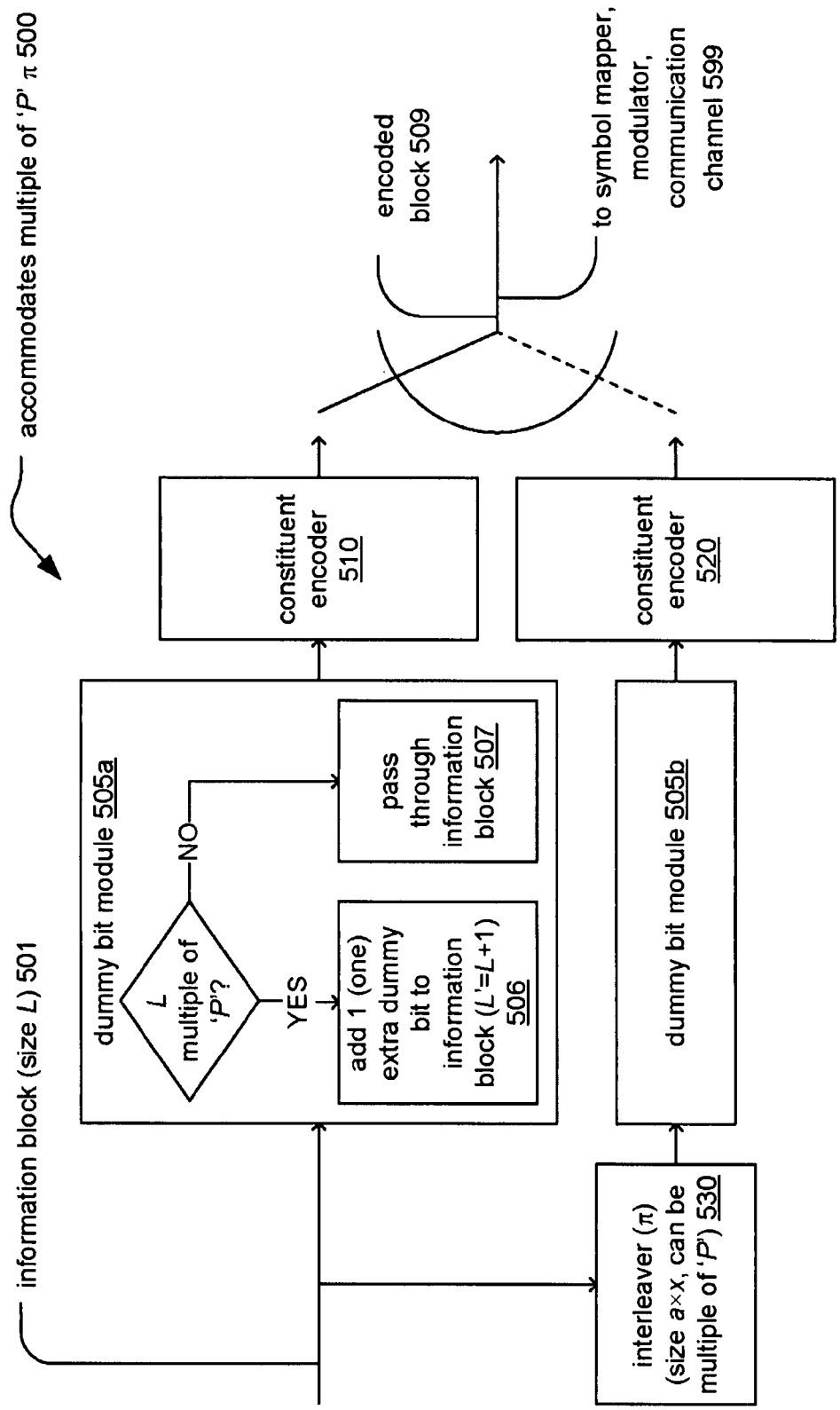
FIG. 5 illustrates an embodiment of a turbo encoder employing tail-biting that can accommodate a multiple of 'P' interleaver ($\pi$).

FIG. 5 illustrates an embodiment of a turbo encoder 500 employing tail-biting that can accommodate a multiple of 'P' interleaver ($\pi$).

If interleaves of size 'P' are allowed in this embodiment. For example, if the QPP interleave ($\pi$) list in Table 3 of reference [14] is used (i.e., this QPP interleave ($\pi$) allows multiple of 7 interleave block size) and if the puncturing turbo encoding approach is used, then the following tail-biting turbo encoding approach can be applied.

(1) Find the smallest L in the list such that $L \geq n$, and pad L−n dummy bits (e.g., 0 bits) at the beginning of the information sequence. Then the padded sequence becomes as follows: $u_0, u_1, \ldots, u_{n-1}, u_n, \ldots, u_{L-1}$.

(2) Compute m=(L' mod(P)) (where P=7 in some embodiments). If m=0, pad one (1) more dummy bit or symbol $u_k$=0 to both the interleaved and the non-interleaved information sequence and let the modified block length (L') be as follows: L'=L+1 and M=1, otherwise let L=L' and M=m.

(3) With $S_{initial}$ state (e.g., use 0 state in some embodiments) encoding information symbols $u_0, u_1, \ldots, u_{L-1}$ (or interleaved symbols $u_{\pi(0)}, u_{\pi(1)}, \ldots, u_{\pi(L-1)}$) to find the final state $S_{final}$ (or $S_{final}'$) (do not store the encoded symbols). Then use Look-up table to find the initial state $S_0 = LT(M, S_{final} - A^M S_{final})$ (or $S_0 = LT(M, S_{final}' - A_M S_{final}')$). If desired in some embodiments, $S_{initial}$ state can be selected to be 0.

(3) Use $S_0$ (or $S_0'$) as initial state to encode $u_0, u_1, \ldots, u_{L-1}$ (or interleaved symbols $u_{\pi(0)}, u_{\pi(1)}, \ldots, u_{\pi(L-1)}$).

This method will transmit 4 extra bits outside the interleaved block for the interleave block size of multiple P (e.g., P=7 in some embodiments). For example, these 4 extra bits include 2 extra data bits and 2 extra redundancy bits in accordance with turbo encoding.

In this embodiment, an information block 501 (of size L), which includes at least one information bit, is provided to a dummy bit module 505a and also to an interleaver ($\pi$) 530. The dummy bit module 505a selectively performs one of two operations, depending on whether the information block size (L) is a multiple of P, and as described in previous embodiments, P=7 in some embodiments. It is noted that an interleaver ($\pi$) 530 is also employed within the turbo encoder 500 that has a block size of a×x. In this instance, the interleaver block size of a×x is specified for the turbo decoder 500, and it is also noted that interleaver size of a×x can be a multiple of 'P'. Again, in the Rel.6, the value of P is 7, but it could be another value in another embodiment.

As shown by a block 506 in the dummy bit module 505a, if the information block size (L) is a multiple of P, then the dummy bit module 505a is operable to add one (1) extra dummy bit to (e.g., at the beginning of) the information block (e.g., a block of size L'=L+1 is provided to a first constituent encoder 510 in this instance). Alternatively, as shown by a block 507 in the dummy bit module 505a, if the information block size (L) is not a multiple of P, then the dummy bit module 505a passes the information block through to the first constituent encoder 510 in such an instance).

Again, the unmodified information block 501 is provided to a bottom path of the turbo encoder 500 that includes the interleaver ($\pi$) 530.

The top path includes the first constituent encoder 510, and the bottom path includes the interleaver ($\pi$) 530 communicatively coupled to a second constituent encoder 520. In the bottom path, after the information block 501 (or modified information block) has undergone interleaving within the interleaver ($\pi$) 530, then the now-interleaved information block (or modified and now-interleaved information block) is passed to a dummy bit module 505b that has a similar architecture and provides similar functionality as the dummy bit module 505a. For example, if the information block size (L) is a multiple of P, then the dummy bit module 505b is operable to add one (1) extra dummy bit to (e.g., at the beginning of) the interleaved information block that is output from the interleaver ($\pi$) 530 before it is provided to a second constituent encoder 520. Alternatively, if the information block size (L) is not a multiple of P, then the dummy bit module 505b passes the interleaved information block that is output from the interleaver ($\pi$) 530 directly to the second constituent encoder 520 without adding any dummy bits thereto.

As can be seen in this embodiment, the size of the information block provided to the first constituent encoder 510 is the same size as the interleaved ($\pi$'ed) block size that is provided from the interleaver ($\pi$) 530 to the second constituent encoder 520.

The outputs from the top and bottom paths (e.g., from the first constituent encoder 510 and the second constituent encoder 520) are alternatively selected and subsequently form an encoded block 509. The encoded block 509 (e.g., the symbols included therein) may then be passed to a symbol mapper where the symbols are mapped according to the appropriate modulation (constellation and mapping). These symbol mapped symbols may then undergo any appropriate modulation as required to generate a continuous-time signal whose format comports with a communication channel into which the turbo coded signal is to be launched.

FIG. 6 illustrates an embodiment of a first constituent encoder 600 of Rel.6 as can be implemented within a turbo encoder.

FIG. 7 illustrates an embodiment of a duo-binary turbo encoder 700.

Figure 8:
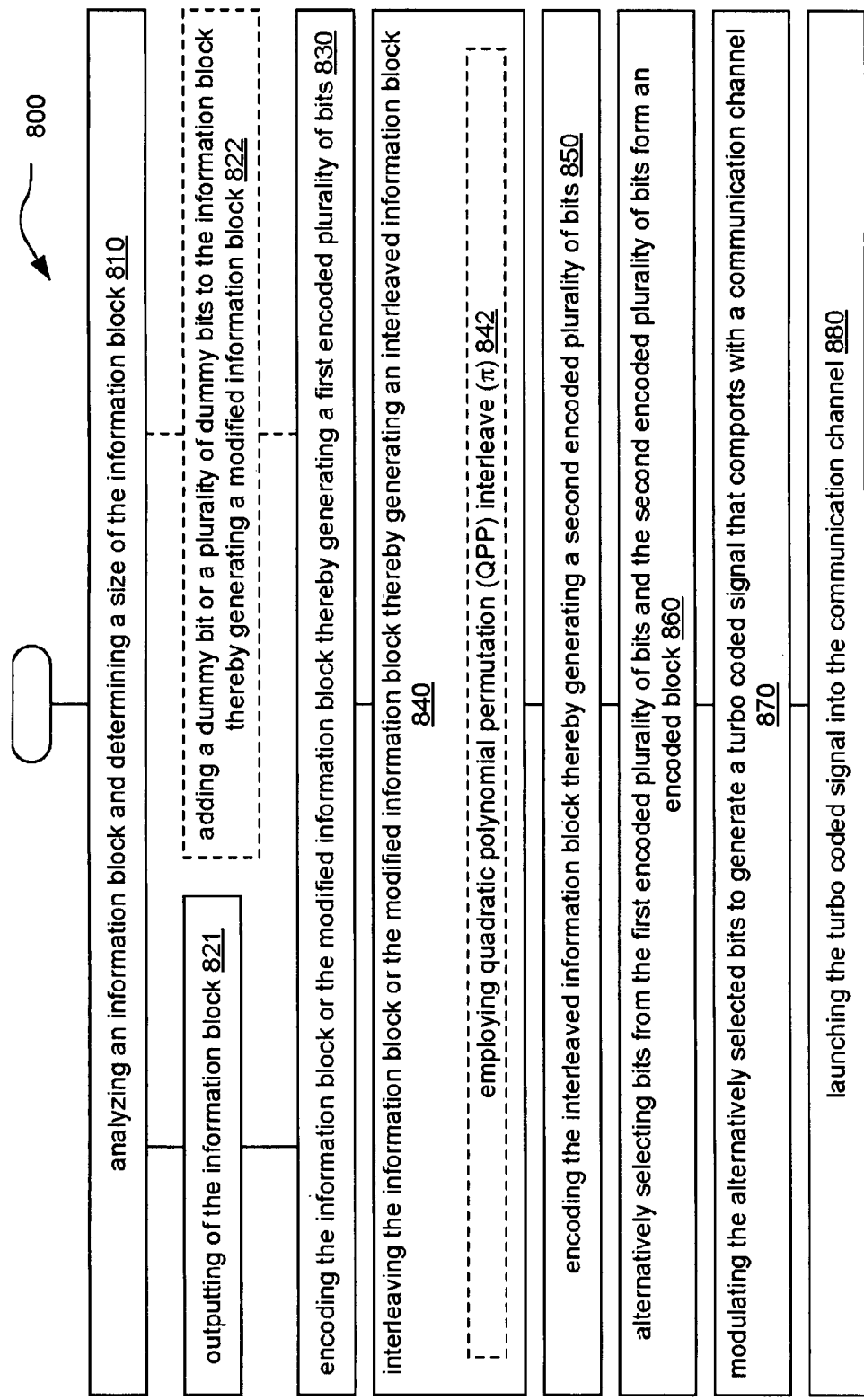
FIG. 8 illustrates an embodiment of a method for performing tail-biting turbo encoding.

FIG. 8 illustrates an embodiment of a method 800 for performing tail-biting turbo encoding. As shown in a block 810, the method 800 begins by analyzing an information block and determining a size of the information block, as shown in a block 810. Thereafter, based on the size of the information block, the method 800 operates by selectively performing one of two options. Either the method 800 operates by outputting of the information block, as shown in a block 821, or the method 800 operates by adding a dummy bit or a plurality of dummy bits to the information block thereby generating a modified information block as shown in a block 822.

The method 800 then continues by encoding the information block or the modified information block thereby generating a first encoded plurality of bits as shown in a block 830. The method 800 then continues by interleaving the information block or the modified information block thereby generating an interleaved information block, as shown in a block 840. In some embodiments, the interleaving operations within the block 840 involve employing a quadratic polynomial permutation (QPP) interleave as shown in a block 842.

The method 800 then continues by encoding the interleaved information block thereby generating a second encoded plurality of bits, as shown in a block 850. The method 800 then continues by alternatively selecting bits from the first encoded plurality of bits and the second encoded plurality of bits form an encoded block, as shown in a block 860. The method 800 then continues by modulating the alternatively selected bits to generate a turbo coded signal that comports with a communication channel, as shown in a block

870. Finally, the method 800 operates by launching the turbo coded signal into the communication channel, as shown in a block 880.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] C. Berrou, Y. Saouter, C. Douillard, S. Kerouédan, and M. Jézéquel, "Designing good permutations for turbo codes: towards a single model," 2004 *IEEE International Conference on Communications (ICC)*, Vol.: 1, pp: 341-345, 20-24 Jun. 2004.
[2] O. Y. Takeshita, "On maximum contention-free interleavers and permutation polynomials over integer rings," IEEE Trans. Information Theory, vol 52, No. 3, March 2006.
[3] System impact of Rel'6 turbo coding tail-bits removal, R1-062157.
[4] 3GPP TS 25.212 V6.8.0 (2006-06), 3rd Generation Partnership Project; Technical Specification Group Radio Access Network; Multiplexing and channel coding (FDD) (Release 6).
[5] C. Weiβ, C. Bettstetter and S. Riedel, "Code Construction and Decoding of Parallel Concatenated Tail-Biting Codes," *IEEE Transactions on Information Theory*, Vol. 47, No. 1, pp. 366-386, January 2001.
[6] Broadcom, "Tail-biting encoding for 3GPP LTE turbo codes of arbitrary number of information bits and performance comparison," 3GPP TSG RAN WG1 #47bis R1-070544.
[7] J. L. Massey and M. K. Sain, "Codes, automata, and continuous systems: Explicit interconnections," *IEEE Trans. Automat. Contr.*, vol. AC-12, no. 6, pp. 644-650, 1967.
[8] Robert J. McEliece. The Algebraic Theory of Convolutional Codes. In *Handbook of Coding Theory*, R. Brualdi, W. C. Human and V. Pless (eds.). Elsevier Science Publishers, Amsterdam, The Netherlands, 1998.
[9] J. Rosenthal, and E. V. York, "BCH Convolutional Codes," *IEEE Transactions on Information Theory*, Vol. 45, No. 6, PP. 1833-1842, September 1999.
[10] H. Gluesing-Luerssen and G. Schneider, "State space realizations and monomial equivalence for convolutional codes", arXiv:cs.IT/0603049, March 2006.
[11] Claude Berrou, Alain Glavieux, and Punya Thitimajshima, "Near Shannon limit error-correcting coding and decoding: turbo codes", *Proc. of IEEE ICC '93*, Geneva, May 1993, pp. 1064-1070.
[12] C. Fragouli and R. Wesel, "Turbo-Encoder Design for Symbol-Interleaved Parallel Concatenated Trellis-Coded Modulation," IEEE *Transactions on Communications*, Vol. 49, No. 3, pp. 425-435, March 2001.
[13] Duo-Binary Turbo Codes for Evolved UTRA, 3*GPP TSG RAN WG*1 #46,*R*1-061973.
[14] Ericsson and Motorola, "QPP interleaver parameters," 3GPP TSG RAN WG1 #47bis R1-070484.
[15] Motorola, "Contention-free Interleaver designs for LTE Turbo Codes," 3GPP TSG RAN WG1 #47bis R1-070054.
[16] Ericsson, "Performance Comparison of LTE Turbo Internal Interleaver Proposals," 3GPP TSG-RAN WG1 #47bis R1-070464.
[17] A. Tarable, S. Benedetto and G. Montorsi "Mapping Interleaving Laws to Parallel Turbo and LDPC Decoder Architectures," *IEEE Trans. on Information Theory*, Vol. 50, No. 9, pp. 2002-2009, September 2004.

What is claimed is:
1. An apparatus, comprising:
a dummy bit module that is operable to analyze an information block, and based on a size of the information block, is operable to:
output the information block; or
add a dummy bit or a plurality of dummy bits to the information block thereby generating a modified information block;
a first constituent encoder that is operable to encode the information block or the modified information block thereby generating a first encoded plurality of bits;
an interleaver module that is operable to interleave the information block or the modified information block thereby generating an interleaved information block;
a second constituent encoder that is operable to encode the interleaved information block thereby generating a second encoded plurality of bits; and wherein:
bits alternatively selected from the first encoded plurality of bits and the second encoded plurality of bits operable to form an encoded block;
the alternatively selected bits operable to undergo modulation to generate a turbo coded signal that comports with a communication channel; and
when a size of the information block is an integer multiple of a predetermined, prohibited value for which tail-biting turbo encoding cannot be performed, the dummy bit module is operable to add one bit to the information block thereby generating the modified information block.

2. The apparatus of claim 1, wherein:
the interleaver module is operable to employ a quadratic polynomial permutation (QPP) interleave when interleaving the information block or the modified information block.

3. The apparatus of claim 1, wherein:
the interleaver module is operable to employ a quadratic polynomial permutation (QPP) interleave when interleaving the information block or the modified information block;
the apparatus is implemented in a first communication device;
the first communication device is a coupled to a second communication device via the communication channel;
the second communication device is operable to receive the turbo coded signal from the communication channel;
the second communication device includes a turbo decoder that is operable to perform decoding processing of the turbo coded signal thereby generating a best estimate of at least one information bit encoded within the turbo coded signal; and
the turbo decoder is operable to employ the QPP interleave and a QPP de-interleave that corresponds to the QPP interleave when performing decoding processing of the turbo coded signal.

4. The apparatus of claim 1, wherein:
when a size of the information block matches an interleaver block size of the interleaver, the dummy bit module is operable to output the information block.

5. The apparatus of claim 1, wherein:
an apparatus being a turbo encoder; and
during encoding of the modified information block, the turbo encoder beginning at an initial state, transitioning through a plurality of states, and ending at a last state being same as the initial state.

6. The apparatus of claim 1, wherein:
the apparatus is implemented within a first communication device;
a turbo decoder is implemented within a second communication device; and
the first communication device and the second communication device are coupled via the communication channel; and wherein:
the turbo decoder includes a plurality of parallel arranged turbo decoders that is operable to decode the turbo coded signal.

7. The apparatus of claim 1, wherein:
the apparatus is implemented within a wireless personal communication device.

8. The apparatus of claim 1, wherein:
the apparatus is a wireless communication device that is operable within a wireless communication system.

9. The apparatus of claim 1, wherein:
the apparatus is operable within at least one of a satellite communication system, a wireless communication system, a wired communication system, and a fiber-optic communication system.

10. An apparatus, comprising:
a dummy bit module that is operable to analyze an information block, and based on a size of the information block, is operable to:
output the information block; or
add a dummy bit or a plurality of dummy bits to the information block thereby generating a modified information block;
a first constituent encoder that is operable to encode the information block or the modified information block thereby generating a first encoded plurality of bits;
an interleaver module that is operable to interleave the information block or the modified information block thereby generating an interleaved information block;
a second constituent encoder that is operable to encode the interleaved information block thereby generating a second encoded plurality of bits; and wherein:
bits alternatively selected from the first encoded plurality of bits and the second encoded plurality of bits operable to form an encoded block;
the alternatively selected bits operable to undergo modulation to generate a turbo coded signal that comports with a communication channel;
when a size of the information block matches an interleaver block size of the interleaver, the dummy bit module is operable to output the information block; and
when the size of the information block is an integer multiple of a predetermined, prohibited value for which tail-biting turbo encoding cannot be performed, the dummy bit module is operable to add one bit to the information block thereby generating the modified information block.

11. The apparatus of claim 10, wherein:
the apparatus is implemented within a first communication device;
a turbo decoder is implemented within a second communication device; and
the first communication device and the second communication device are coupled via the communication channel; and wherein:
the turbo decoder includes a plurality of parallel arranged turbo decoders that is operable to decode the turbo coded signal.

12. The apparatus of claim 10, wherein:
the apparatus is operable within at least one of a satellite communication system, a wireless communication system, a wired communication system, and a fiber-optic communication system.

13. An apparatus, comprising:
a dummy bit module that is operable to analyze an information block, and based on a size of the information block, is operable to:
output the information block when a size of the information block matches a predetermined interleaver block size; or
add one bit to the information block thereby generating a modified information block when a size of the information block is an integer multiple of a predetermined, prohibited value for which tail-biting turbo encoding cannot be performed;
a first constituent encoder that is operable to encode the information block or the modified information block thereby generating a first encoded plurality of bits;
an interleaver module that is operable to employ a quadratic polynomial permutation (QPP) interleave to interleave the information block or the modified information block thereby generating an interleaved information block;
a second constituent encoder that is operable to encode the interleaved information block thereby generating a second encoded plurality of bits; and wherein:
bits alternatively selected from the first encoded plurality of bits and the second encoded plurality of bits operable to form an encoded block; and the alternatively selected bits operable to undergo modulation to generate a turbo coded signal that comports with a communication channel.

14. The apparatus of claim 13, wherein:
when the size of the information block is the integer multiple of the predetermined, prohibited value for which tail-biting turbo encoding cannot be performed, the dummy bit module is operable to add the one bit to a beginning of the information block thereby generating the modified information block.

15. The apparatus of claim 13, wherein:
the interleaver module is operable to employ a quadratic polynomial permutation (QPP) interleave when interleaving the information block or the modified information block;
the apparatus is implemented in a first communication device;
the first communication device is a coupled to a second communication device via the communication channel;
the second communication device is operable to receive the turbo coded signal from the communication channel;
the second communication device includes a turbo decoder that is operable to perform decoding processing of the turbo coded signal thereby generating a best estimate of at least one information bit encoded within the turbo coded signal; and
the turbo decoder is operable to employ the QPP interleave and a QPP de-interleave that corresponds to the QPP interleave when performing decoding processing of the turbo coded signal.

16. The apparatus of claim 13, wherein:
an apparatus being a turbo encoder; and
during encoding of the modified information block, the turbo encoder beginning at an initial state, transitioning through a plurality of states, and ending at a last state being same as the initial state.

17. The apparatus of claim 13, wherein:
the apparatus is implemented within a first communication device;
a turbo decoder is implemented within a second communication device; and
the first communication device and the second communication device are coupled via the communication channel; and wherein:
the turbo decoder includes a plurality of parallel arranged turbo decoders that is operable to decode the turbo coded signal.

18. The apparatus of claim 13, wherein:
the apparatus is implemented within a wireless personal communication device.

19. The apparatus of claim 13, wherein:
the apparatus is a wireless communication device that is operable within a wireless communication system.

20. The apparatus of claim 13, wherein:
the apparatus is operable within at least one of a satellite communication system, a wireless communication system, a wired communication system, and a fiber-optic communication system.

* * * * *